US012001279B2

(12) United States Patent
Rapalli et al.

(10) Patent No.: US 12,001,279 B2
(45) Date of Patent: Jun. 4, 2024

(54) ERROR PROTECTION FOR MANAGED MEMORY DEVICES

(71) Applicant: Micron Technology, Inc., Boise, ID (US)

(72) Inventors: Chandrakanth Rapalli, Hyderabad (IN); Yoav Weinberg, Toronto (CA); Tal Sharifie, Lehavim (IL)

(73) Assignee: Micron Technology, Inc., Boise, ID (US)

( * ) Notice: Subject to any disclaimer, the term of this patent is extended or adjusted under 35 U.S.C. 154(b) by 50 days.

(21) Appl. No.: 18/048,284

(22) Filed: Oct. 20, 2022

(65) Prior Publication Data

US 2024/0134740 A1    Apr. 25, 2024

(51) Int. Cl.
  *G06F 11/10*    (2006.01)
  *H03M 13/00*    (2006.01)
  *H03M 13/09*    (2006.01)

(52) U.S. Cl.
  CPC ....... *G06F 11/1004* (2013.01); *H03M 13/095* (2013.01); *H03M 13/611* (2013.01); *G06F 11/1008* (2013.01)

(58) Field of Classification Search
  CPC ............ G06F 11/1004; G06F 11/1008; H03M 13/095; H03M 13/611
  See application file for complete search history.

(56) References Cited

U.S. PATENT DOCUMENTS

| 6,996,097 | B1* | 2/2006 | Chou | H04L 1/0017 |
| | | | | 370/389 |
| 8,555,142 | B2* | 10/2013 | Grube | G06F 11/10 |
| | | | | 714/764 |
| 2011/0208995 | A1* | 8/2011 | Hafner | G06F 11/1474 |
| | | | | 711/155 |
| 2013/0179753 | A1* | 7/2013 | Flynn | H05K 7/1444 |
| | | | | 714/773 |
| 2016/0011790 | A1* | 1/2016 | Rostoker | G06F 12/0868 |
| | | | | 711/103 |
| 2018/0069658 | A1* | 3/2018 | Benisty | H03M 13/15 |
| 2019/0102114 | A1* | 4/2019 | Sela | G06F 12/1466 |
| 2022/0291994 | A1* | 9/2022 | Matsuura | G06F 3/0679 |

* cited by examiner

*Primary Examiner* — Steve N Nguyen
(74) *Attorney, Agent, or Firm* — Holland & Hart

(57) ABSTRACT

Methods, systems, and devices for error protection for managed memory devices are described. In some examples, a memory system may receive data units from a host device. The data units may include respective sets of parity bits, and the memory system may perform an error detection operation on the data units. A first controller of the memory system may generate a protocol unit using data (e.g., a subset of data) from the data units. The protocol unit may include a set of parity bits (e.g., a different set of parity bits), and a second controller of the memory system may perform an error detection operation on the protocol unit. The second controller of the memory system may generate a data storage unit using data (e.g., a subset of data) from the protocol unit, and may store the data unit and another set of parity bits to a memory device.

25 Claims, 7 Drawing Sheets

ERROR PROTECTION FOR MANAGED MEMORY DEVICES

FIELD OF TECHNOLOGY

The following relates to one or more systems for memory, including error protection for managed memory devices.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
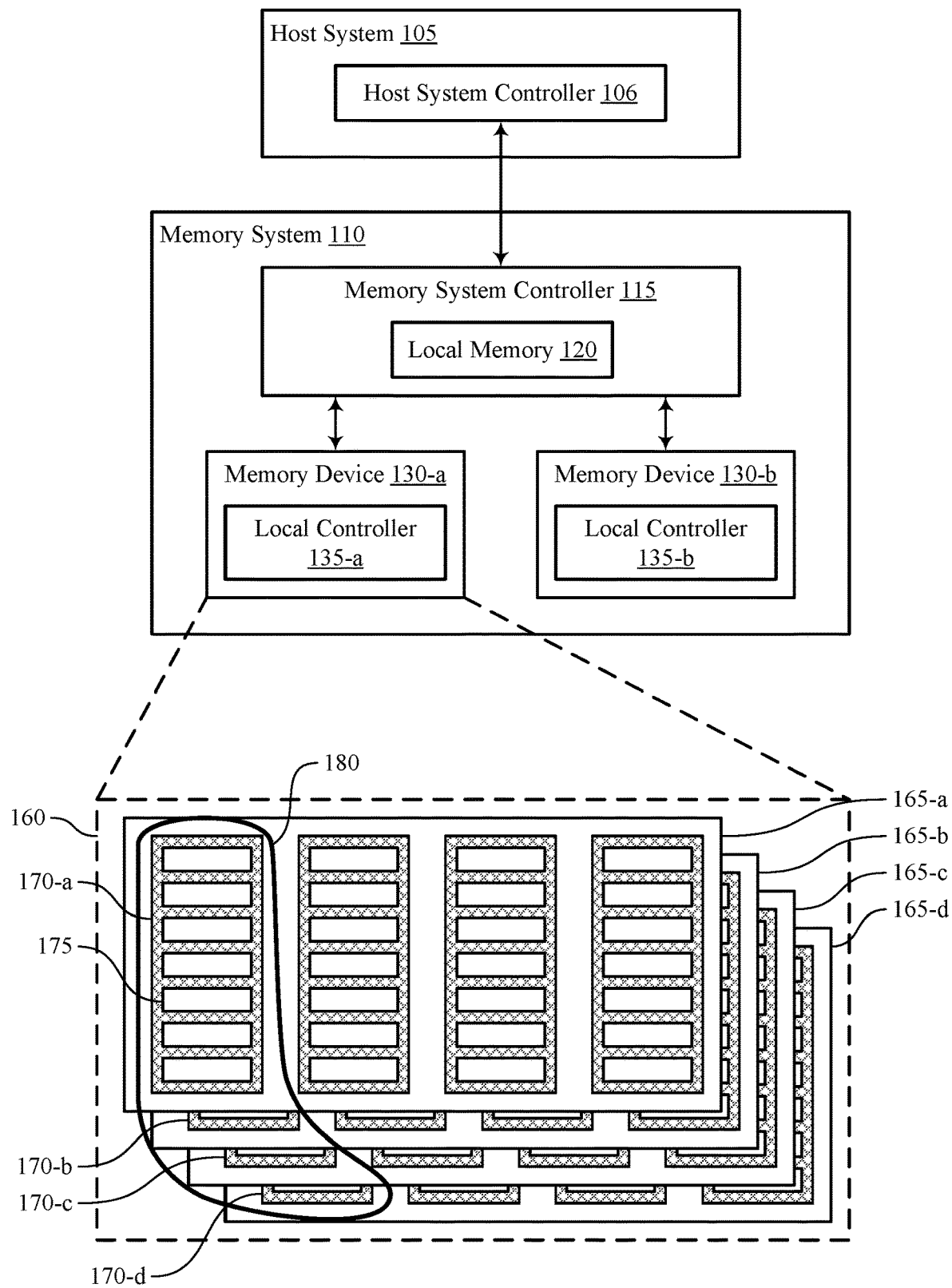
FIG. 1 illustrates an example of a system that supports error protection for managed memory devices in accordance with examples as disclosed herein.

Some memory systems may include circuitry configured to detect errors associated with various operations or various components of the memory system. Such memory systems may be incorporated in environments such as vehicle safety systems, autonomous vehicle systems, or other safety-critical systems, that may have strict requirements. For example, a memory system may include error detection capabilities for data communicated between the memory system and a host device. However, in some instances, errors or faults associated with data that occur internal to the memory device may go undetected. That is, if a fault exists in a data path of a memory system, data may still be written to or read from a memory device included in the memory system, but the data may be corrupt. Accordingly, techniques for enhancing error detection internally to a memory system may be desirable.

A memory system configured to detect errors or faults from when data is received from a host system to when the data is stored to the memory device, or from when data is read from the memory device to when the data is transmitted to the host device is described herein. In some examples, the memory system may be configured to detect such errors or faults using an end-to-end (E2E) cyclic redundancy check (CRC). For example, a controller (e.g., an interface controller, a UniPro® controller) of the memory system may receive a plurality of data units from a host device and each data unit may include one or more fields. In some instances, each data unit may include a respective set of parity bits. The controller may perform an error detection operation on the respective data units to identify any potential errors in the data. When no errors are present, the interface controller may generate a protocol unit (e.g., a Universal Flash Storage Protocol Information Unit (UPIU)) based on data included in each of the received data units. The interface controller may also generate respective sets of parity bits that are included in the UPIU.

In some examples, the interface controller may communicate the UPIU to a data storage controller, which may process the UPIU. For example, the data storage controller may perform an error detection operation to identify any potential errors in the UPIU (e.g., using the respective sets of parity bits). When no errors are present, the data storage controller may process the UPIU (or more than one UPIU) to obtain a data storage unit. Additionally or alternatively, the data storage controller may generate a check code based on the data block. That is, the data storage controller may assemble a data block using one or more UPIUs, and may generate a check code based on the entire block (e.g., based on the one or more assembled UPIUs). The check code, which may be referred to as an E2E CRC may allow the memory system to identify errors that occur in the data block (e.g., in any of the associated UPIUs) from when the plurality of data units are received from the host device. Accordingly, by generating parity bits and/or check codes (and performing associated error detection operations) associated with the data storage unit, errors that occur along the data path of the memory system may be detected, which may improve the overall performance and reliability of the memory system.

Figure 2:
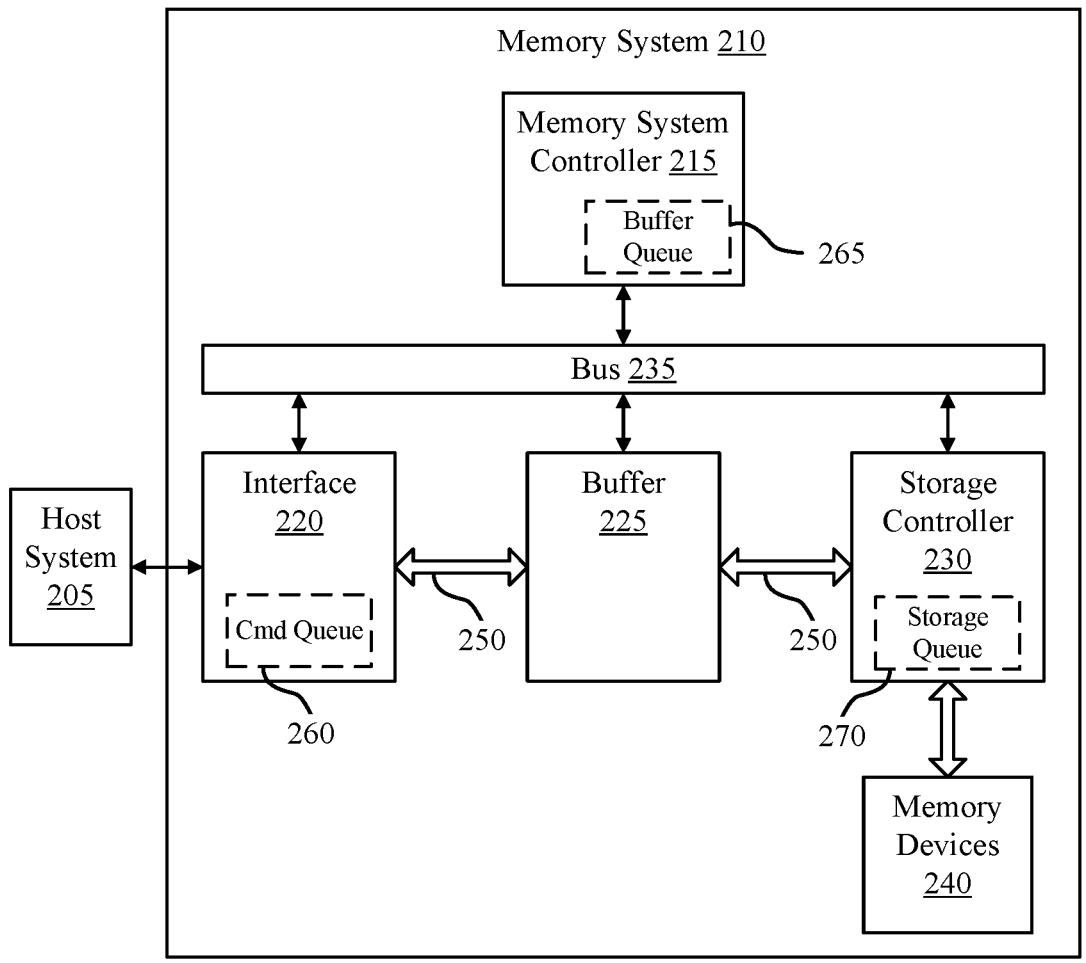
FIG. 2 illustrates an example of a system that supports error protection for managed memory devices in accordance with examples as disclosed herein.

Features of the disclosure are initially described in the context of systems, devices, and circuits with reference to FIGS. 1 and 2. Features of the disclosure are described in the context of systems, block diagrams, and process flow diagrams with reference to FIGS. 3 through 5. These and other features of the disclosure are further illustrated by and described in the context of an apparatus diagram and flowchart that relate to error protection for managed memory devices with reference to FIGS. 6 and 7.

FIG. 1 illustrates an example of a system 100 that supports error protection for managed memory devices in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165-*c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

The system 100 may include any quantity of non-transitory computer readable media that support error protection for managed memory devices. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

In some examples, the memory system controller 115 may receive data units from the host system 105. Each data unit may include a set of fields and a set of parity bits associated with the set of fields. Upon receiving the data units, the memory system controller 115 may perform an error detection operation by generating respective sets of parity bits to compare with the first set of parity bits and the second set of parity bits. If no errors are detected, the memory system controller 115 may generate a protocol unit (e.g., a UPIU) using first data from a subset of the first set of fields and second data from a subset of the second set of fields.

The memory system controller 115 may include one or more controllers to perform the error control functions described herein. For example, the memory system controller 115 may perform an error detection operation on the generated UPIU by generating respective sets of check bits to compare with the respective sets of parity bits. If no errors are detected, the memory system controller 115 may process the protocol unit to obtain a data storage unit.

The data storage unit may be associated with the data block received from the host system 105. Additionally or alternatively, the data storage unit may include a check code generated from the data block received from the host system 105. The memory system controller 115 may generate and transmit a plurality of codewords (e.g., one or more codewords associated with the data storage unit) to the memory device 130-a. In some examples, the plurality of codewords may be associated with the check code for storing at the memory device 130-a. The codewords and respective check codes, among other parity bits, may be written to the one or more memory cells of the memory device 130-a. By generating parity bits (and performing error detection operations) associated with the protocol unit, data storage unit, and codewords, errors that occur along the data path of the memory system 110 may be detected or corrected, which may improve its overall performance and reliability.

FIG. 2 illustrates an example of a system 200 that supports error protection for managed memory devices in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, when the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed herein. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the described operations in conjunction with or instead of the memory system controller 215. In some cases, the memory system controller 215 may perform the functions of the storage controller 230 and the storage controller 230 may be omitted.

In some examples, the memory system controller 215 may receive data units from the host system 205. Each data unit may include a set of fields and a set of parity bits associated with the set of fields. Upon receiving the data units, the memory system controller 215 may perform an error detection operation by generating respective sets of parity bits to compare with the first set of parity bits and the second set of parity bits. If no errors are detected, the memory system controller 215 may generate a protocol unit (e.g., a UPIU) using first data from a subset of the first set of fields and second data from a subset of the second set of fields.

The memory system controller 215 may include one or more controllers to perform the error control functions described herein. For example, the memory system controller 215 may perform an error detection operation on the generated UPIU by generating respective sets of check bits to compare with the respective sets of parity bits. If no errors are detected, the memory system controller 115 may process the protocol unit to obtain a data storage unit.

The data storage unit may be associated with the data block received from the host system 205. Additionally or alternatively, the data storage unit may include a check code generated from the data block received from the host system 205. The memory system controller 215 may generate and transmit a plurality of codewords (e.g., one or more codewords associated with the data storage unit) to the memory device 240. In some examples, the plurality of codewords may be associated with the check code for storing at the memory device 240. The codewords and respective check codes, among other parity bits, may be written to the one or more memory cells of the memory device 240. By generating parity bits (and performing error detection operations) associated with the protocol unit, data storage unit, and codewords, errors that occur along the data path of the memory system 210 may be detected or corrected, which may improve its overall performance and reliability.

Figure 3:
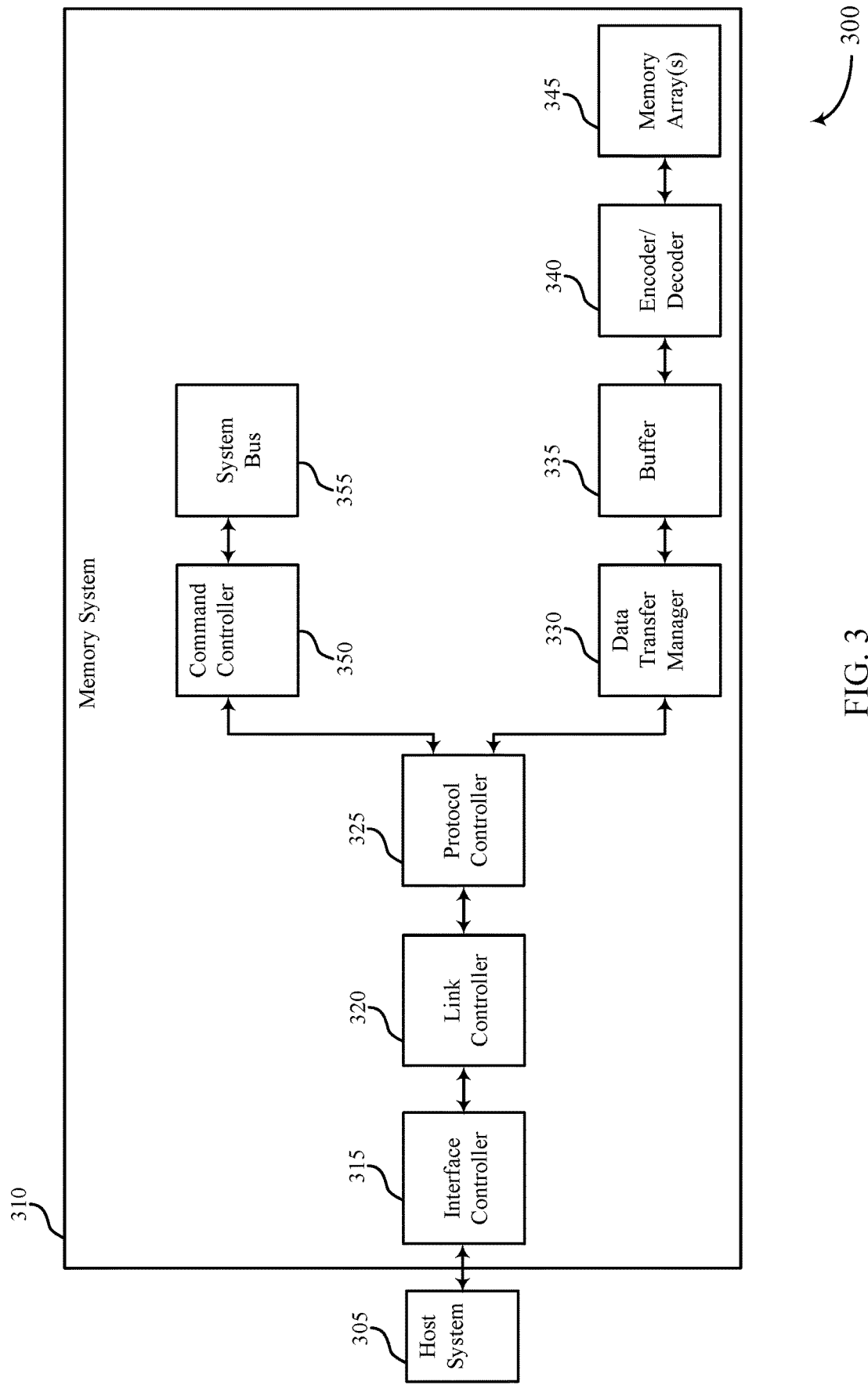
FIG. 3 illustrates an example of a system that supports error protection for managed memory devices in accordance with examples as disclosed herein.

FIG. 3 illustrates an example of a system 300 that supports error protection for managed memory devices in accordance with examples as disclosed herein. In some examples, the system 300 may include a host system 305 and a memory system 310. The host system 305 and the memory system 310 may be examples of the host system 205 and the memory system 210, respectively, as described with reference to FIG. 2. The memory system 310 may include an interface controller 315, a link controller 320, and a protocol controller 325. The memory system 310 may also include a data transfer manager (DTM) 330, a buffer 335, an encoder/decoder 340, and one or more memory arrays 345, which may be utilized when processing data. For example, the memory arrays 345 may include one or more memory devices, and each memory device may include one or more memory die (e.g., one or more NAND memory die).

Additionally or alternatively, the memory system 310 may include a command controller 350 and a system bus 355 which may be utilized when processing control information. The components of the memory system 310 may be configured to generate parity bits and perform error detection and correction operations associated with data paths of the memory system 310. By generating parity bits and/or check codes (and performing associated error detection operations) associated with the data storage unit and codewords, errors that occur along the data path of the memory system may be detected, which may improve the overall performance and reliability of the memory system.

The host system 305 may communicate with the memory system 310 via a host-driven logical block interface (e.g., an interface managed by the host system 305). For example, the host system 305 may transmit packets that include one or more payloads. As used herein, a data block may include data (e.g., data from respective payloads) from one or more packets received from the host system 305. In some instances, the payloads may be associated with respective commands (e.g., read commands, write commands, other commands) received from the host system 305. For example, the host system 305 may transmit a write command and one or more packets (e.g., that collectively correspond to a data block) to the memory system 310. Thus, a data block may refer to a unit of data transferred according to block access commands (e.g., a minimum addressable block size). The packets may be received by the interface controller 315 and commands included in the packets may be processed by the protocol controller 325.

In some examples, the host system 305 may communicate the packets to the interface controller 315, which may utilize a UniPro® protocol stack and may include a physical interface that includes one or more serial data lanes. As described herein, the interface controller 315 may be configured to generate protocol units (e.g., upon receiving a write command from the host system 305) and data units (e.g., upon receiving a read command from the host system 305) for communicating to the link controller 320 and the host system 305, respectively.

The memory system 310 may include a link controller 320 that is coupled with the interface controller 315. In some instances, the link controller 320 may be referred to as a Universal Flash Storage (UFS) link controller 320, and may operate according to a UFS protocol. The link controller 320 may receive protocol units from the interface controller 315, in the instance of a write operation, and may communicate the protocol units to the protocol controller 325. In the instance of read operations, the link controller 320 may receive protocol units from the protocol controller 325 and may communicate the protocol units to the interface controller 315.

In some examples, the memory system 310 may include a protocol controller 325 that is coupled with the link controller 320. The protocol controller 325 may operate according to a UFS protocol and may receive protocol units from the link controller 320 (e.g., during a write operation). As described herein, the interface controller 315 may utilize a UniPro® protocol stack. However, upon receiving a command (e.g., a read command) and performing certain operations on fields of the command to generate a protocol unit, the protocol unit may be communicated to the protocol controller 325 using signaling that is the same as or resembles UFS signaling (e.g., conforms to a UFS protocol). When the protocol controller 325 receives the protocol unit, it can either communicate the protocol unit to the DTM 330 if the protocol unit is associated with data or to the command controller 350 if the protocol unit is associated with control information.

The DTM 330 may receive (e.g., obtain) and process the protocol unit. In some examples, the DTM 330 may process the protocol unit to obtain a data storage unit, which may be written to a memory array 345. Before the data storage unit is written to a memory array 345, the DTM 330 may process one or more protocol units to generate the data storage unit. For example, the DTM 330 may generate the (e.g., build) the data storage unit using one or more protocol units. The DTM 330 may then generate respective sets of parity bits using data in the data storage units to compare with parity bits included in each protocol unit. If the sets of parity bits match, the DTM 330 may determine that the data storage unit was generated correctly. In some examples, a data storage unit may include at least portions (e.g., information from data fields) of more than one protocol unit (e.g., a plurality of protocol units), however in some examples a data storage unit may include one protocol unit. Upon generating the data storage unit, the DTM 330 may generate a check code (e.g., an E2E CRC) using the data storage unit. For example, the check code may be generated using the data included in the data storage unit, which may correspond to the data block (e.g., data corresponding to a block of LBAs that are accessed as part of an access operation according to the protocol used by the protocol controller 325) received from the host system 305. As described herein, the check code may allow for the identification of any errors in the data that occurred while the data is within the memory system 310.

Additionally or alternatively, the protocol controller 325 may communicate a protocol unit associated with control information to the command controller 350. As used herein, the term control information may refer to any information associated with a command received from the host system 305 other than data to be read from or written to a memory array 345. In some examples, the protocol unit comprising the control information may be processed by the command controller 350 and may be communicated to a system bus 355. The system bus 355 may communicate the control information to a portion or component of the memory system 310 associated with the control information. The system bus 355 may be an example of the bus 235 of FIG. 2.

After generating the data storage unit that includes the data from the data block and corresponding check code, the DTM 330 may break the data storage unit into one or more data words. As used herein, a data word may correspond to a size of data that is smaller than the data storage unit. Additionally or alternatively, each data word may be a same or a different size than a protocol unit. The respective data words may be transmitted by the DTM 330 to the buffer 335. In some examples, a communication channel between the DTM and the buffer 335 may include at least one bit (e.g., at least one parity bit) used for bus parity. For example, the data words may be transferred over the communication channel by way of a quantity of data channels (e.g., 8, 16, 32, 64) and a quantity of data cycles (e.g., 8, 16, 32, 64). The communication channel may include one or more bus parity channels which may carry parity information associated with the data channels for each data cycle. When a data word is received by the buffer 335, the buffer 335 may generate at least one bit (e.g., for each data cycle) to determine whether an error occurred between the DTM 330 and the buffer 335 (e.g., when the data word was transmitted on the bus between the DTM 330 and the buffer 335).

The encoder/decoder 340 may read the codewords from the buffer 335. The communication channel between the buffer and the encoder/decoder 340 may also include a quantity of data channels (e.g., 8, 16, 32, 64) and one or more bus parity channels. When the encoder/decoder 340 receives a data word, the encoder/decoder 340 may generate at least one bit to determine whether an error occurred between the buffer 335 and the encoder/decoder 340 (e.g., when the data word was transmitted on the communication channel between the buffer 335 and the encoder/decoder 340). If no errors are detected, the encoder/decoder 340 may encode the data words according to a first error protection scheme to create codewords (e.g., first codewords) from each data word and may store the respective codewords to the memory array(s) 345. For example, the first error protection scheme may be a linear block code (e.g., LDPC) that generates codewords with first error protection codes. For example, each codeword may include systematic bits and parity bits generated according to the first error protection scheme.

In some cases, the buffer 335 may include a second error protection scheme to detect errors, correct errors, or both, in data words stored to the buffer 335. For example, the buffer may include a second error protection scheme (e.g., a SEC or SECDED error protection scheme). If no errors are detected from the bus parity on data words received from the DTM, the buffer 335 may generate a codeword (e.g., a SECDED codeword, a second codeword) for each data word and may store the respective second codewords to the buffer 335. For example, the codeword may include the data bits of the data word and a second error protection code. Upon outputting codewords read by the encoder/decoder 340, the buffer 335 may run an error protection process according to the second error protection scheme to identify, or to correct, or both, any errors that occurred while the respective data was stored to the buffer 335. For example, the buffer 335 may generate, for each second codeword, a syndrome based at least in part on a data portion of each second codeword and the second error protection code of each second codeword. If no errors exist for a codeword (e.g., the syndrome for each second codeword of the plurality of second codewords indicating no errors or correctable errors in each second codeword), the buffer 335 may recreate the data word from the respective codeword and may transmit the data words to the encoder/decoder 340. If the syndrome for one or more of the codewords indicates the presence of an error, the buffer 335 may corrupt at least one bit of the one or more codewords based at least in part on the second error protection code indicating a non-correctable error.

Accordingly, the plurality of first codewords may be stored to the memory array(s) 345. The data associated with each codeword of the plurality of first codewords may be or may represent data associated with the data block received from the host system 305.

When a command is received by the protocol controller 325 and the command controller 350 to read the data block, the codewords of the plurality of first codewords may be read from the memory array(s) 345 by the encoder/decoder 340. The encoder/decoder 340 may run a decoding process according to the first error protection scheme on each codeword of the plurality of first codewords to generate the data words. In some cases, the decoding process may generate the most probable candidate data word from each codeword (e.g., a decoding process for a linear block code).

The encoder/decoder 340 may then send each of the data words to the buffer 335 (e.g., over the communication channel including bus parity). The buffer 335 may again check the parity information received with the data over the bus parity, and may store the data words. The buffer 335 may encode the data words received from the encoder/decoder according to the second error protection scheme, and may, upon the DTM reading the data words from the buffer, run the error protection process according to the second error protection scheme to identify, or to correct, or both, any errors that occurred while the respective data was stored to the buffer 335.

Although the buffer 335 and the encoder/decoder 340 may employ error protection schemes on data words to obtain the first and second codewords, the error protection schemes may return corrupt data in some circumstances. For example, an error protection scheme such as LDPC or SECDED may return an erroneous data word when there are a quantity of bit errors exceeding a threshold without an indication that an error has occurred. Additionally, the bus parity on the communication channels between the DTM 330 and the buffer 335, and the buffer 335 and the encoder/decoder 340 may only be able to detect single bit errors within a quantity (e.g., 8, 16) data bits. Thus, one or more bits may become corrupt in data words stored to the memory array(s) 345 or retrieved from the memory array(s) 345. In addition to the data of the data block being stored to the memory array(s) 345, the check code may be stored as part of the codewords associated with the data block such that, when the data is read from the memory array(s) 345 (e.g., when the individual first codewords are each read), a check value can be generated and compared with the check code to determine whether the data is associated with an error. Because the check code of the data block may be run on a larger quantity of bits (e.g., of the data block), and may include a larger quantity of parity bits than the error protection schemes for the data words, the check code may detect if any of the data words are erroneous as a result of being stored at the buffer. Accordingly, by employing an E2E CRC (as well as other error detection and correction schemes), the overall performance and reliability of the memory system 310 may be improved.

Figure 4:
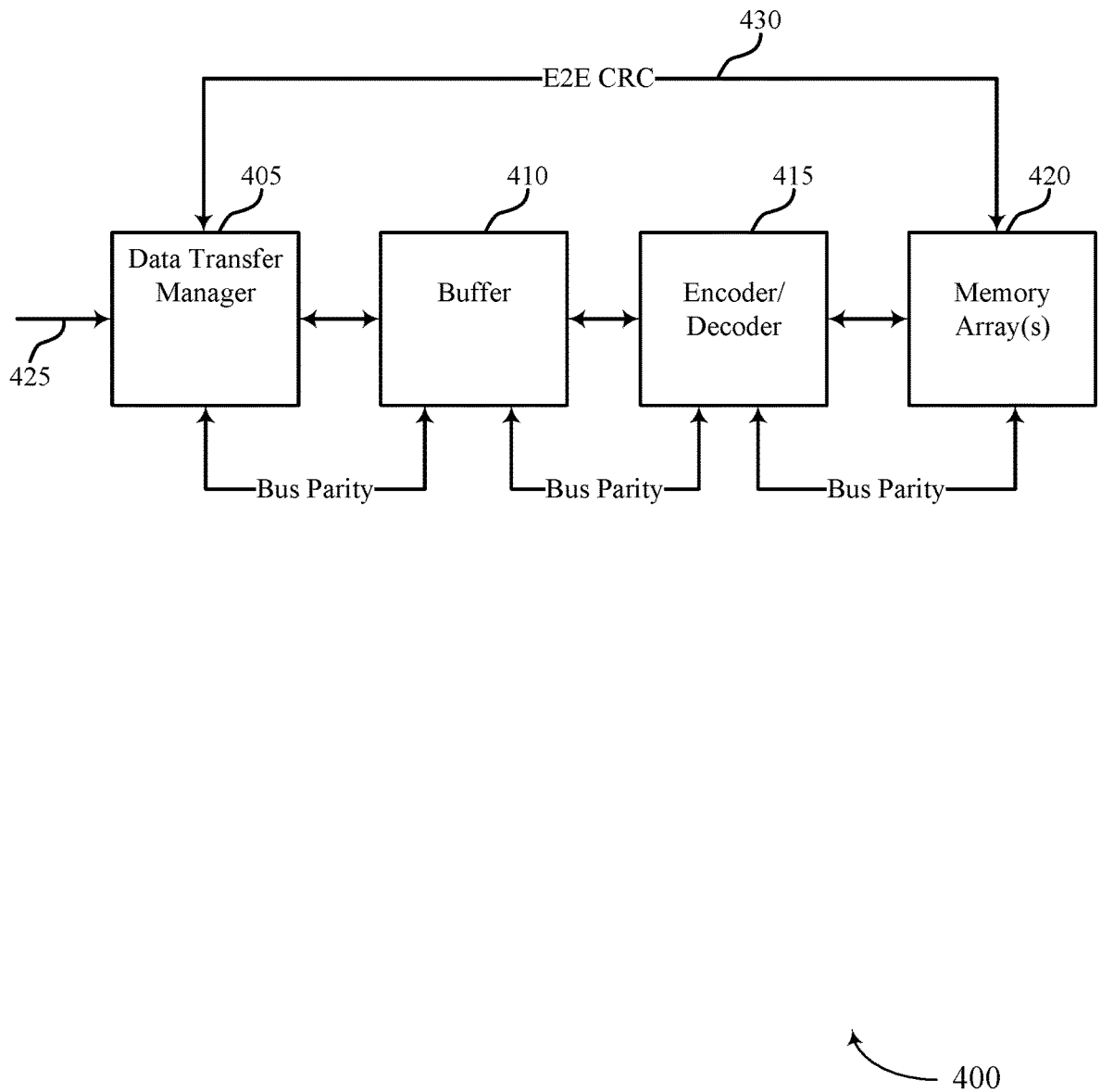
FIG. 4 illustrates an example of a block diagram that supports error protection for managed memory devices in accordance with examples as disclosed herein.

FIG. 4 illustrates an example of a block diagram 400 that supports error protection for managed memory devices in accordance with examples as disclosed herein. In some examples, the block diagram 400 may illustrate aspects of the system 300 described with reference to FIG. 3. For example, the block diagram may illustrate a data transfer manager (DTM) 405, a buffer 410, an encoder/decoder 415, and one or more memory arrays 420, which may be examples of the interface controller 315, the DTM 330, the buffer 335, and the memory array(s) 345 as described with reference to FIG. 3. The components described with reference to FIG. 4 may be configured to generate parity bits (e.g., E2E parity bits) and perform error detection and correction operations associated with data paths of a memory system. By generating parity bits and/or check codes (and performing associated error protection operations) associated with the data storage unit and codewords, errors that occur along the data path of the memory system may be detected, which may improve the overall performance and reliability of the memory system.

As described herein, the DTM 405 may receive (e.g., obtain) and process protocol units received from a protocol controller (e.g., a protocol controller 325 as described with reference to FIG. 3). In some examples, the DTM 405 may process a subset of the protocol units to obtain a data storage unit, which may be written to a memory array 420. Upon generating the data storage unit, the DTM 405 may generate a check code (e.g., an E2E CRC 430) using the data storage unit. For example, the check code may be generated using the data included in the data storage unit, which may correspond to a data block received from a host system. As described herein, the check code may allow for the identification of errors in the data block from generation of the data storage unit at the DTM 405 through storing codewords in the memory array 420 and back to the DTM for processing into protocol units.

As described herein, write commands may be processed and a protocol unit (e.g., a UPIU) may be generated (e.g., by a protocol controller 325 as described with reference to FIG. 3). For example, the UPIU may include data from one or more payloads (e.g., payloads from respective data packets received from a host system). As described herein, a UPIU may include data from multiple (e.g., more than one) data units, and a data storage unit may include data from multiple (e.g., more than one) UPIUs. In some examples, the protocol unit may be received by the DTM 405 via a bus 425 having a width of 64 or 128 bits with byte parity, meaning that a UPIU transmitted via a bus having a width of 64 bits may include 64 bits of data and 8 bits of byte parity transmitted per clock cycle.

Upon receiving the protocol units, the DTM 405 may generate the (e.g., build) the data storage unit using one or more protocol units. The DTM 405 may then generate respective sets of parity bits using data in the data storage units to compare with parity bits included in each protocol unit. If the sets of parity bits match, the DTM 405 may determine that the data storage unit was generated correctly.

To generate the data storage unit, the DTM 405 may selectively remove some data (e.g., some fields) from the protocol units. For example, some fields that do not include payload data or identify a destination location for the data may not be included in the data storage unit. Thus, a data storage unit may include, for example, data corresponding to the data block received from the host system and a check code (e.g., a CRC) generated using the data block. The check code, which may be referred to as E2E CRC 430, may eventually be stored to a portion of a memory array 420 and may be used as part of an error detection operation when reading the associated data from the memory array 420. That is, the data storage unit including E2E CRC 430 may be stored to a portion of the memory array 420 after additional operations are performed by the buffer 410 and the encoder/decoder 415. In some cases, the generation of E2E CRC 430 may be seeded with the address for the data block (e.g., a first LBA of the data block).

After generating the data storage unit and corresponding check code, the DTM 405 may break the data storage unit into one or more data words, which may each be a same or a different size than a protocol unit. The respective data words may be transmitted by the DTM 405 to the buffer 410 and a communication channel between the DTM 405 and the buffer 410 may include at least one bit (e.g., at least one parity bit) used for bus parity (e.g., bus parity between the DTM 405 and the buffer 410). In some examples, the DTM 405 may transfer the data words to the buffer 410 via one or more buffer channels that couple the DTM 405 with the buffer 410. For example, the buffer channels may include data channels and parity channels and the codewords may be transferred over one or more clock cycles. When a data word is received by the buffer 410, the buffer 410 may generate at least one bit (e.g., for each received data word) to determine whether an error occurred between the DTM 405 and the buffer 410. If no errors are detected, the buffer 410 may generate a codeword (e.g., a SECDED codeword, a second codeword) for each data word and may store the respective second codewords to the buffer 410.

When data words are read out of the buffer 410 by the encoder/decoder 415, the buffer 410 may run an error protection operation using the SECDED scheme to identify and correct errors that occurred while the respective second codeword was stored to the buffer 410. If no errors exist for a codeword, the buffer 410 may recreate the data word from the respective codeword and may transmit the data words to the encoder/decoder 415. The communication channel between the buffer 410 and the encoder/decoder 415 may also include bus parity.

When the encoder/decoder 415 receives a data word, the encoder/decoder 415 may generate at least one bit to determine whether an error occurred between the buffer 410 and the encoder/decoder 415 (e.g., when the data word was transmitted on the communication channel between the buffer 410 and the encoder/decoder 415). If no errors are detected, the encoder/decoder 415 may encode the data words according to a first error protection scheme to create codewords (e.g., first codewords) from each data word and may store the respective codewords to the memory array(s) 420. For example, the first error protection scheme may be a linear block code (e.g., LDPC) that generates codewords with redundancy information (e.g., systematic bits and parity bits).

Accordingly, the plurality of first codewords may be stored to the memory array(s) 420. The data associated with each codeword of the plurality of first codewords may be or may represent data associated with the data block received from the host system. In addition to the data of the data block being stored to the memory array(s) 420, the check code may be stored with the codewords such that, when the data of the data block is read from the memory array(s) 420 (e.g., when the individual first codewords are each read), a check value can be generated and compared with the check code to determine whether the data is associated with an error.

A host system may transmit a read command to the memory system associated with the data block. For example, the host system may transmit a first read command, for data stored to a memory array, to the memory system. Upon receiving the first read command, the command may be processed by the FTL (e.g., by a memory system controller 215 as described with reference to FIG. 2), which may determine a physical address of the memory array(s) 420 to read the data from. The command may be placed in a queue of the encoder/decoder 415, which may process the command by reading the data (e.g., the first codewords) from the memory array(s) 420. The encoder/decoder 415 may then run a decoding process according to the first error protection scheme on each of the first codewords to generate the data words. In some cases, the decoding process may generate the most probable candidate data word from each of the first codewords (e.g., a decoding process for a linear block code). The encoder/decoder 340 may then send each of the data words to the buffer 335 (e.g., over the communication channel including bus parity), may indicate (e.g., to the FTL) that the command has been processed. The buffer 335 may again check the parity information received with the data over the bus parity, and may store the data words. The buffer 335 may encode the data words received from the encoder/decoder according to the second error protection scheme. The FTL may put the command into a front-end queue (e.g., a queue associated with the protocol controller 325 or another controller as described with reference to FIG. 3), for processing. The protocol controller may indicate to the DTM 405 to read the data words associated with the data block from the buffer 410. The buffer 410 may, upon the DTM 405 reading the data words from the buffer, run the error protection process according to the second error protection scheme to identify, or to correct, or both, any errors that occurred while the respective data was stored to the buffer 410.

Once the command has been put into the front-end queue, the host system may be notified that the data is ready, and the data (e.g., the data words) may be transferred from the buffer (e.g., via the DTM 405) to the host system. For example, the buffer 410 may transmit the data words to the DTM 405, which may generate a data block and a check value using the data words. The DTM 405 may compare the check value with the check code. If the check value does not match the check code, the DTM 405 may corrupt at least one bit of the data block (or one bit in one or more UPIUs generated by the DTM 405). That is, for byte parity that is communicated between the interface controller and the DTM 405 via UFS, either the data or byte parity may be corrupted so that the UniPro block sees a byte parity error, which it knows to then corrupt the data relative to the parity information in the UniPro packets. Accordingly, the host system may receive data packets that include a mismatch between the data and the parity information in the packets, and thus may attempt to re-read the data from the memory system.

However, if the check value matches the check code, the DTM 405 may generate one or more UPIUs using the data block. The UPIUs may be used to generate one or more data packets (e.g., by the interface controller), and the data packets may be transmitted to the host system to satisfy the read command. Accordingly, by generating parity bits and/or check codes (and performing associated error detection operations) associated with the data storage unit and codewords, errors that occur along the data path of the memory system may be detected, which may improve the overall performance and reliability of the memory system.

Figure 5:
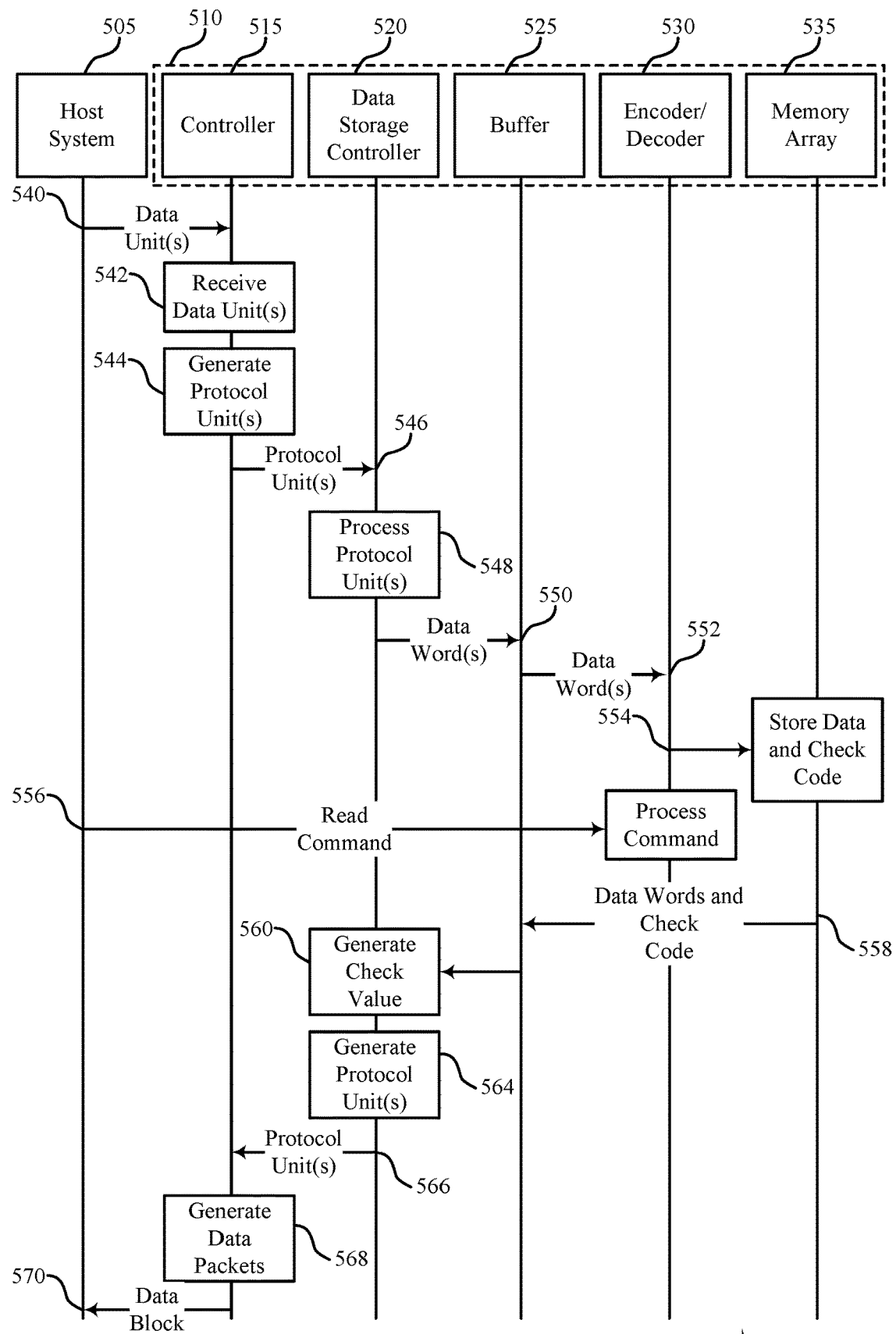
FIG. 5 illustrates an example of a process flow diagram that supports error protection for managed memory devices in accordance with examples as disclosed herein.

FIG. 5 illustrates an example of a process flow diagram 500 that supports error protection for managed memory devices in accordance with examples as disclosed herein. In some examples, the process flow diagram 500 may illustrate one or more operations performed at a memory system 510. The memory system 510 may be coupled with a host system 505 and may include a controller 515 (which may represent an interface controller, a protocol controller, or both as described herein), a data storage controller 520 (e.g., a DTM 520), a buffer 525, an encoder/decoder 530, and a memory array 535 (e.g., one or more memory devices, one or more memory die). In some examples, the controller 515, the DTM 520, the buffer 525, and the memory array 535 may be examples of the interface controller 315, the DTM 330, the buffer 335, and the memory array 345 as described with reference to FIG. 3. The memory system 510 may include other components, such as the components described with reference to FIG. 3, that are not shown. The process flow diagram 500 may illustrate the processing and generation of E2E CRC as described herein, which may improve the overall performance and reliability of the memory system 510.

At 540, the host system 505 may transmit one or more data packets to the memory system 510 as part of a write command. For example, the host system 505 may transmit a plurality of data packets that each include respective first data and a set of parity bits. At 542, the controller 515 of the memory system 510 may receive the respective data packets (e.g., that include the first data and first set of parity bits). For example, an interface controller as described herein may receive the packets including the first data unit and the second data unit.

At 544, the controller 515 may generate a protocol unit (e.g., a UPIU) using the first data unit. For example, a protocol controller as described herein may process the respective first data (e.g., of at least a subset of the plurality of data packets) to generate a protocol unit. As described herein, the protocol unit may include data that is associated with a same destination device ID and/or a same destination port ID. Thus, for exemplary purposes, it may be understood that the respective first data included in the protocol unit are associated with a same destination device ID and/or a same destination port ID. At 546, the controller 515 may transmit the protocol unit to the DTM 520.

At 548, the DTM 520 may process the protocol units. In some examples, the DTM 520 may process the protocol units to obtain a data storage unit. To generate the data storage unit, the DTM 520 may selectively remove some data (e.g., some fields) from the protocol units. For example, some fields that do not include payload data or identify a destination location for the data may not be included in the data storage unit. Thus, a data storage unit may include, for example, data corresponding to the data block received from the host system 505 and a check code (e.g., a CRC) generated using the data block. The check code, which may be referred to as E2E CRC, may eventually be stored to a portion of a memory array 535 and may be used as part of an error detection operation when reading the associated data from the memory array 535. That is, the data storage unit and E2E CRC may be stored to a portion of the memory array after additional operations are performed by the buffer 525 and the encoder/decoder 530. In some cases, the generation of the E2E CRC may be seeded with the address for the data block (e.g., a first LBA of the data block).

After generating the data storage unit and corresponding check code, the DTM 520 may break the data storage unit into one or more data words, which may each be a same or a different size than a protocol unit. At 550, the respective data words may be transmitted by the DTM 520 to the buffer 525 and may be sent over a communication channel including at least one parity bit used for bus parity (e.g., bus parity between the DTM 520 and the buffer 525). In some examples, the DTM 520 may transfer the data words to the buffer 525 via one or more buffer channels that couple the DTM 520 with the buffer 525.

At 552, the buffer 525 may transmit the data word to the encoder/decoder 530. As described herein, when a data word is received by the buffer 525, the buffer 525 may generate at least one bit (e.g., for each received data cycle of the communication channel) to determine whether an error occurred between the DTM 520 and the buffer 525. If no errors are detected, the buffer 525 may generate a codeword (e.g., a SECDED codeword, a second codeword) for each data word and may store the respective second codewords to the buffer 525.

The encoder/decoder 530 may then receive commands to read the data words from the buffer 525 and store the data of the data words to the memory array 535. The buffer 525 may then run a SECDED scheme to identify and correct any errors that occurred while the respective second codeword was stored to the buffer 525. If no errors exist for a codeword, the buffer 525 may recreate the data word from the respective codeword (e.g., with an additional bit for bus parity between the buffer 525 and the encoder/decoder 415) and may transmit the data words to the encoder/decoder 530.

At 554, the encoder/decoder 530 may transmit a plurality of first codewords and the associated check code to the memory array 535. When the encoder/decoder 530 receives a data word, the encoder/decoder 530 may generate at least one bit to determine whether an error occurred between the buffer 525 and the encoder/decoder 530 (e.g., when the data word was transmitted on the bus between the buffer 525 and the encoder/decoder 530). If no errors are detected, the encoder/decoder 530 may generate codewords (e.g., first codewords) according to the first error protection scheme (e.g., a linear block code) from each data word and may store the respective codewords to the memory array 535.

Accordingly, the plurality of first codewords may be stored to the memory array 535. The data associated with each codeword of the plurality of first codewords may be or may represent data associated with the data block received from the host system. In addition to the data being stored to the memory array 535, the check code may be stored with the codewords such that, when the data is read from the memory array 535 (e.g., when the individual first codewords are each read), a check value can be generated and compared with the check code to determine whether the data is associated with an error.

At 556, the host system 505 may transmit a read command to the memory system 510 and the encoder/decoder 530 may process the command. The command may be received by the FTL (not shown), and may be placed in a queue of the encoder/decoder 530, which may process the command by reading the data (e.g., the first codewords) from the memory array 535 and decoding the respective first codewords by running a decoding process according to the first error protection scheme to create data words from each first codeword. At 558, the data and corresponding check code may be read from the memory array 535 to the buffer 525. The encoder/decoder 530 may indicate (e.g., to the FTL) that the command has been processed, and may put the command into a front-end queue (e.g., a queue associated with the protocol controller 325 or another controller as described with reference to FIG. 3).

At 560, the DTM 520 may receive the data words and corresponding check code from the buffer 525, and may assemble a data block and generate a check value. The DTM 520 may compare the check value with the check code. If the check value does not match the check code, the DTM 520 may corrupt at least one bit of the data block (or one bit in one or more UPIUs generated by the DTM 520). However, if the check value and the check code match, the DTM 520 may transmit the data block without corrupting any bits.

At 564, the DTM 520 may generate one or more UPIUs using the data block. The UPIUs may be used to generate one or more data packets (e.g., by the interface controller). At 566, the UPIUs may be transmitted to the controller 515. At 568, the controller 515 may generate one or more data packets for transmitting to the host system 505. At 570, the data packets may be transmitted to the host system 505 to satisfy the read command. Accordingly, by generating parity bits and/or check codes (and performing associated error detection operations) associated with the data storage unit and codewords, errors that occur along the data path of the memory system may be detected, which may improve the overall performance and reliability of the memory system.

Figure 6:
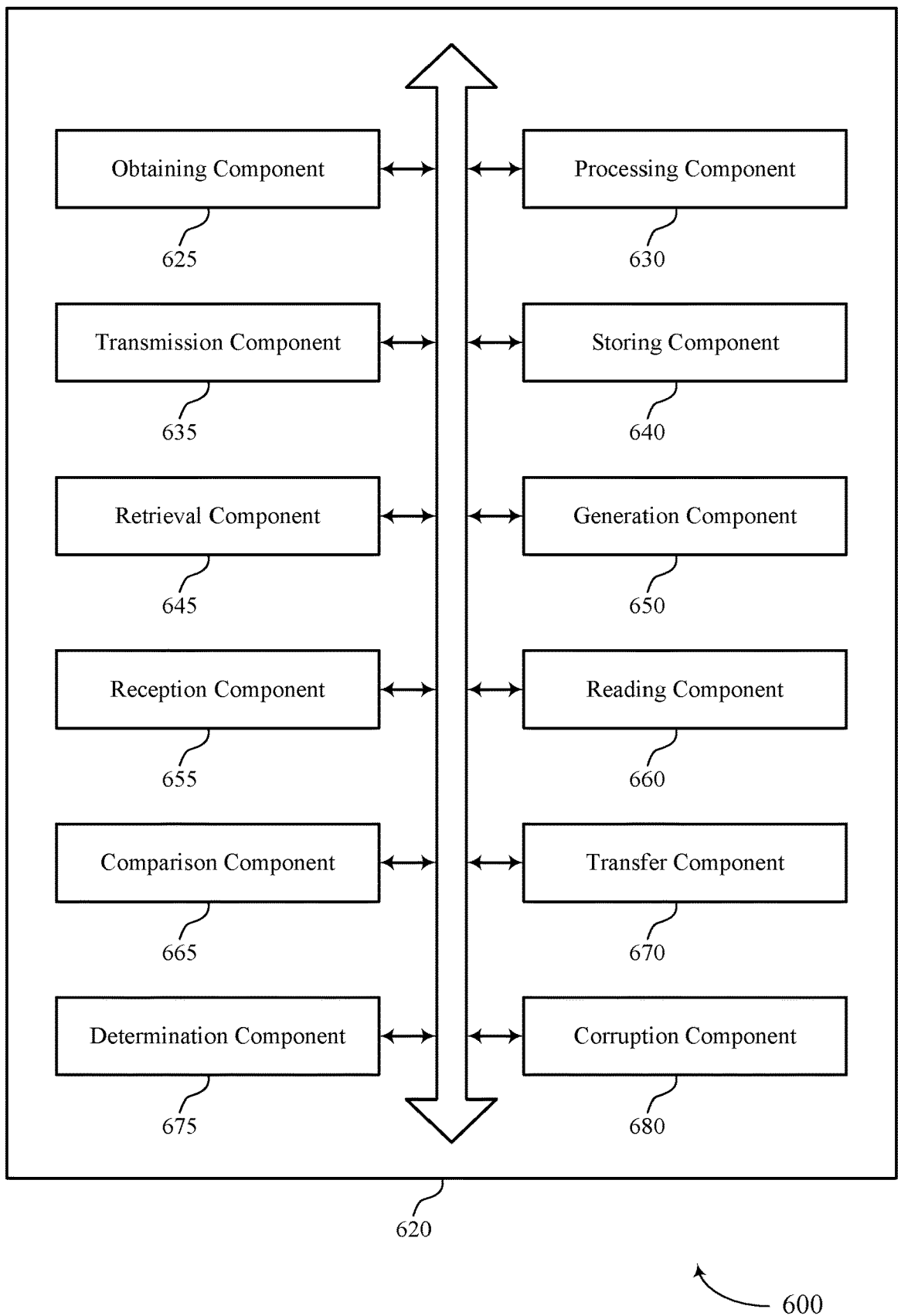
FIG. 6 shows a block diagram of a managed memory system controller that supports error protection for managed memory devices in accordance with examples as disclosed herein.

FIG. 6 shows a block diagram 600 of a managed memory system controller 620 that supports error protection for managed memory devices in accordance with examples as disclosed herein. The managed memory system controller 620 may be an example of aspects of a managed memory system controller as described with reference to FIGS. 1 through 5. The managed memory system controller 620, or various components thereof, may be an example of means for performing various aspects of error protection for managed memory devices as described herein. For example, the managed memory system controller 620 may include an obtaining component 625, a processing component 630, a transmission component 635, a storing component 640, a retrieval component 645, a generation component 650, a reception component 655, a reading component 660, a comparison component 665, a transfer component 670, a determination component 675, a corruption component 680, or any combination thereof. Each of these components may communicate, directly or indirectly, with one another (e.g., via one or more buses).

The obtaining component 625 may be configured as or otherwise support a means for obtaining a plurality of protocol units associated with a data block, where each protocol unit of the plurality of protocol units includes a respective set of first data and a respective first set of parity bits.

The processing component 630 may be configured as or otherwise support a means for processing a first subset of the plurality of protocol units to obtain a first data storage unit based at least in part on the respective first sets of parity bits matching respective second sets of parity bits generated from the respective sets of first data for the first subset of the plurality of protocol units, where the first data storage unit includes the data block and a check code generated from the data block. In some examples, to support reading the data block and the check code, the processing component 630 may be configured as or otherwise support a means for processing the plurality of first codewords according to the first error protection scheme to obtain the data block and the check code.

The transmission component 635 may be configured as or otherwise support a means for transmitting a plurality of first codewords to a memory array of a memory system, where the plurality of first codewords include the data block and the check code, and where each first codeword includes a first error protection code associated with a first error protection scheme. In some examples, the transmission component 635 may be configured as or otherwise support a means for transmitting a second plurality of protocol units including the data block, where each protocol unit of the plurality of second protocol units includes a respective set of second data and a respective third set of parity bits.

In some examples, the transmission component 635 may be configured as or otherwise support a means for transmitting the data block to a host system based at least in part on corrupting the at least one bit associated with the data block.

In some examples, to support transmitting the plurality of first codewords, the storing component 640 may be configured as or otherwise support a means for storing a plurality of second codewords in a buffer, where the plurality of second codewords include the data block and the check code, and where each second codeword includes a second error protection code.

In some examples, to support transmitting the plurality of first codewords, the retrieval component 645 may be configured as or otherwise support a means for retrieving the plurality of second codewords from the buffer.

In some examples, to support transmitting the plurality of first codewords, the generation component 650 may be configured as or otherwise support a means for generating the plurality of first codewords based at least in part on running a second error protection scheme on the plurality of second codewords. In some examples, to support running the second error protection scheme, the generation component 650 may be configured as or otherwise support a means for generating, for each second codeword, a syndrome based at least in part on a data portion of the each second codeword and the second error protection code of the each second codeword.

In some examples, to support obtaining the plurality of protocol units, the generation component 650 may be configured as or otherwise support a means for generating the plurality of protocol units based at least in part on the respective third sets of parity bits matching respective fourth sets of parity bits generated from the respective portions of first data for the set of data units. In some examples, the generation component 650 may be configured as or otherwise support a means for generating a check value based at least in part on reading the data block from the memory array.

In some examples, to support obtaining the plurality of protocol units, the reception component 655 may be configured as or otherwise support a means for receiving a set of data units associated with the data block, where each data unit of the set of data units includes a respective portion of one or more of the sets of first data and a respective set of third parity bits. In some examples, the reception component 655 may be configured as or otherwise support a means for receiving a read command for the data block.

In some examples, the reading component 660 may be configured as or otherwise support a means for reading the data block and the check code from the memory array based at least in part on receiving the read command. In some examples, to support reading the data block and the check code, the reading component 660 may be configured as or otherwise support a means for reading the plurality of first codewords from the memory array.

In some examples, the comparison component 665 may be configured as or otherwise support a means for comparing the check code and the check value based at least in part on generating the check value.

In some examples, to support storing the plurality of second codewords to the buffer, the transfer component 670 may be configured as or otherwise support a means for transferring, to the buffer, the plurality of second codewords via a first data channel over a plurality of clock cycles, where, for each of the plurality of clock cycles, the transferring includes transferring, over a first parity channel, first parity information for the first data channel. In some examples, to support retrieving the plurality of second codewords from the buffer, the transfer component 670 may be configured as or otherwise support a means for transferring, from the buffer, the plurality of second codewords via a second data channel over a plurality of clock cycles, where, for each of the plurality of clock cycles, the transferring includes transferring, over a second parity channel, second parity information for the second data channel.

In some examples, the determination component 675 may be configured as or otherwise support a means for determining that the check code matches the check value. In some examples, the determination component 675 may be configured as or otherwise support a means for determining that the check code does not match the check value.

In some examples, the corruption component 680 may be configured as or otherwise support a means for corrupting at least one bit of a first codeword of the plurality of first codewords based at least in part on the second error protection code of a corresponding one of the second codewords indicating a non-correctable error. In some examples, the corruption component 680 may be configured as or otherwise support a means for corrupting at least one bit associated with the data block based at least in part on determining that the check code does not match the check value.

In some examples, the plurality of first codewords are transmitted to the memory array of the memory system based at least in part on the syndrome for the each second codeword of the plurality of second codewords indicating no errors or correctable errors in the each second codeword. In some examples, the set of data units are received via a host-driven logical block interface of an interface controller.

In some examples, the interface controller receives the set of data units via a physical interface including one or more serial data lanes. In some examples, the check code is seeded with an address associated with the data block. In some examples, the plurality of protocol units each include a Universal Flash Storage Protocol Information Unit (UPIU).

Figure 7:
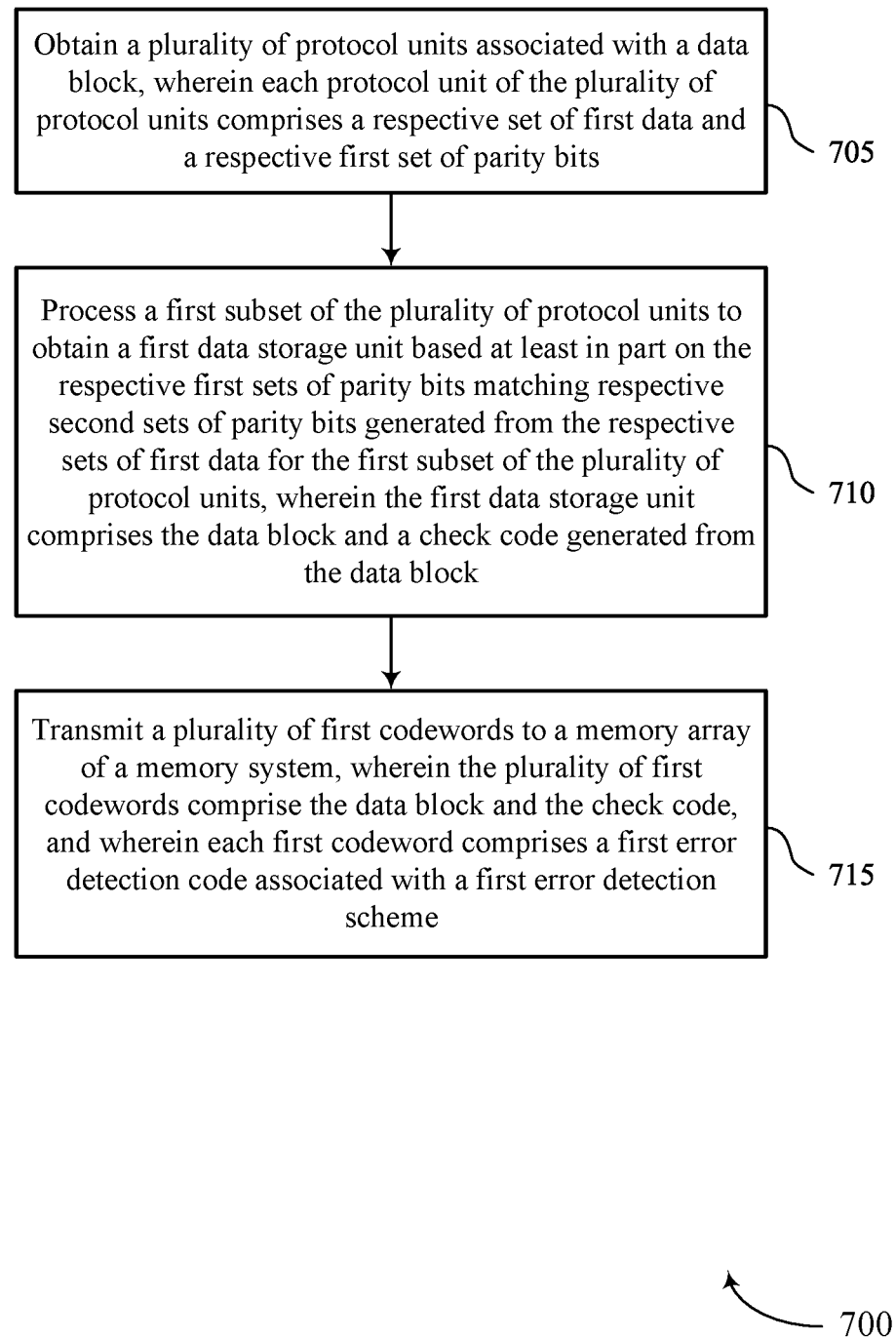
FIG. 7 shows a flowchart illustrating a method or methods that support error protection for managed memory devices in accordance with examples as disclosed herein.

FIG. 7 shows a flowchart illustrating a method 700 that supports error protection for managed memory devices in accordance with examples as disclosed herein. The operations of method 700 may be implemented by a managed memory system controller or its components as described herein. For example, the operations of method 700 may be performed by a managed memory system controller as described with reference to FIGS. 1 through 6. In some examples, a managed memory system controller may execute a set of instructions to control the functional elements of the device to perform the described functions. Additionally, or alternatively, the managed memory system controller may perform aspects of the described functions using special-purpose hardware.

At 705, the method may include obtaining a plurality of protocol units associated with a data block, where each protocol unit of the plurality of protocol units includes a respective set of first data and a respective first set of parity bits. The operations of 705 may be performed in accordance with examples as disclosed herein. In some examples, aspects of the operations of 705 may be performed by an obtaining component 625 as described with reference to FIG. 6.

At 710, the method may include processing a first subset of the plurality of protocol units to obtain a first data storage unit based at least in part on the respective first sets of parity bits matching respective second sets of parity bits generated from the respective sets of first data for the first subset of the plurality of protocol units, where the first data storage unit includes the data block and a check code generated from the data block. The operations of 710 may be performed in accordance with examples as disclosed herein. In some examples, aspects of the operations of 710 may be performed by a processing component 630 as described with reference to FIG. 6.

At 715, the method may include transmitting a plurality of first codewords to a memory array of a memory system, where the plurality of first codewords include the data block and the check code, and where each first codeword includes a first error protection code associated with a first error protection scheme. The operations of 715 may be performed in accordance with examples as disclosed herein. In some examples, aspects of the operations of 715 may be performed by a transmission component 635 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for obtaining a plurality of protocol units associated with a data block, where each protocol unit of the plurality of protocol units includes a respective set of first data and a respective first set of parity bits; processing a first subset of the plurality of protocol units to obtain a first data storage unit based at least in part on the respective first sets of parity bits matching respective second sets of parity bits generated from the respective sets of first data for the first subset of the plurality of protocol units, where the first data storage unit includes the data block and a check code generated from the data block; and transmitting a plurality of first codewords to a memory array of a memory system, where the plurality of first codewords include the data block and the check code, and where each first codeword includes a first error protection code associated with a first error protection scheme.

Aspect 2: The method, apparatus, or non-transitory computer-readable medium of aspect 1 where transmitting the plurality of first codewords includes operations, features, circuitry, logic, means, or instructions, or any combination thereof for storing a plurality of second codewords in a buffer, where the plurality of second codewords include the data block and the check code, and where each second codeword includes a second error protection code; retrieving the plurality of second codewords from the buffer; and generating the plurality of first codewords based at least in part on running a second error protection scheme on the plurality of second codewords.

Aspect 3: The method, apparatus, or non-transitory computer-readable medium of aspect 2 where running the second error protection scheme includes operations, features, circuitry, logic, means, or instructions, or any combination thereof for generating, for each second codeword, a syndrome based at least in part on a data portion of the each second codeword and the second error protection code of the each second codeword.

Aspect 4: The method, apparatus, or non-transitory computer-readable medium of aspect 3 where the plurality of first codewords are transmitted to the memory array of the memory system based at least in part on the syndrome for the each second codeword of the plurality of second codewords indicating no errors or correctable errors in the each second codeword.

Aspect 5: The method, apparatus, or non-transitory computer-readable medium of any of aspects 3 through 4, further including operations, features, circuitry, logic, means, or instructions, or any combination thereof for corrupting at least one bit of a first codeword of the plurality of first codewords based at least in part on the second error protection code of a corresponding one of the second codewords indicating a non-correctable error.

Aspect 6: The method, apparatus, or non-transitory computer-readable medium of any of aspects 2 through 5 where storing the plurality of second codewords to the buffer includes operations, features, circuitry, logic, means, or instructions, or any combination thereof for transferring, to the buffer, the plurality of second codewords via a first data channel over a plurality of clock cycles, where, for each of the plurality of clock cycles, the transferring includes transferring, over a first parity channel, first parity information for the first data channel.

Aspect 7: The method, apparatus, or non-transitory computer-readable medium of any of aspects 2 through 6 where retrieving the plurality of second codewords from the buffer includes operations, features, circuitry, logic, means, or instructions, or any combination thereof for transferring, from the buffer, the plurality of second codewords via a second data channel over a plurality of clock cycles, where, for each of the plurality of clock cycles, the transferring includes transferring, over a second parity channel, second parity information for the second data channel.

Aspect 8: The method, apparatus, or non-transitory computer-readable medium of any of aspects 1 through 7 where obtaining the plurality of protocol units includes operations, features, circuitry, logic, means, or instructions, or any combination thereof for receiving a set of data units associated with the data block, where each data unit of the set of data units includes a respective portion of one or more of the sets of first data and a respective set of third parity bits and generating the plurality of protocol units based at least in part on the respective third sets of parity bits matching respective fourth sets of parity bits generated from the respective portions of first data for the set of data units.

Aspect 9: The method, apparatus, or non-transitory computer-readable medium of aspect 8 where the set of data units are received via a host-driven logical block interface of an interface controller.

Aspect 10: The method, apparatus, or non-transitory computer-readable medium of aspect 9 where the interface controller receives the set of data units via a physical interface including one or more serial data lanes.

Aspect 11: The method, apparatus, or non-transitory computer-readable medium of any of aspects 1 through 10 where the check code is seeded with an address associated with the data block.

Aspect 12: The method, apparatus, or non-transitory computer-readable medium of any of aspects 1 through 11, further including operations, features, circuitry, logic, means, or instructions, or any combination thereof for receiving a read command for the data block; reading the data block and the check code from the memory array based at least in part on receiving the read command; generating a check value based at least in part on reading the data block from the memory array; and comparing the check code and the check value based at least in part on generating the check value.

Aspect 13: The method, apparatus, or non-transitory computer-readable medium of aspect 12, further including operations, features, circuitry, logic, means, or instructions, or any combination thereof for determining that the check code matches the check value and transmitting a second plurality of protocol units including the data block, where each protocol unit of the plurality of second protocol units includes a respective set of second data and a respective third set of parity bits.

Aspect 14: The method, apparatus, or non-transitory computer-readable medium of any of aspects 12 through 13, further including operations, features, circuitry, logic, means, or instructions, or any combination thereof for determining that the check code does not match the check value; corrupting at least one bit associated with the data block based at least in part on determining that the check code does not match the check value; and transmitting the data block to a host system based at least in part on corrupting the at least one bit associated with the data block.

Aspect 15: The method, apparatus, or non-transitory computer-readable medium of any of aspects 12 through 14 where reading the data block and the check code includes operations, features, circuitry, logic, means, or instructions, or any combination thereof for reading the plurality of first codewords from the memory array and processing the plurality of first codewords according to the first error protection scheme to obtain the data block and the check code.

Aspect 16: The method, apparatus, or non-transitory computer-readable medium of any of aspects 1 through 15 where the plurality of protocol units each include a Universal Flash Storage Protocol Information Unit (UPIU).

It should be noted that the described methods include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if" "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and a second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and a second condition or action may occur directly as a result of the previous condition or action occurring independent of whether other conditions or actions occur. In some examples, a first condition or action may be performed and the second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a controller associated with a memory device, wherein the controller is configured to cause the apparatus to:
obtain a plurality of protocol units associated with a data block, wherein each protocol unit of the plurality of protocol units comprises a set of first data and a respective first set of parity bits;
process a first subset of the plurality of protocol units to obtain a first data storage unit based on respective first sets of parity bits matching respective second sets of parity bits generated from respective sets of first data for the first subset of the plurality of protocol units, wherein the first data storage unit comprises the data block and a check code generated from the data block; and
transmit a plurality of first codewords to a memory array of a memory system, wherein the plurality of first codewords comprise the data block and the check code, and wherein each first codeword comprises a first error protection code associated with a first error protection scheme.

2. The apparatus of claim 1, wherein, to transmit the plurality of first codewords, the controller is configured to cause the apparatus to:
store a plurality of second codewords in a buffer, wherein the plurality of second codewords comprise the data block and the check code, and wherein each second codeword comprises a second error protection code;
retrieve the plurality of second codewords from the buffer; and
generate the plurality of first codewords based on running a second error protection scheme on the plurality of second codewords.

3. The apparatus of claim 2, wherein, to run the second error protection scheme, the controller is configured to cause the apparatus to:
generate, for each second codeword, a syndrome based at least in part on a data portion of the each second codeword and the second error protection code of the each second codeword.

4. The apparatus of claim 3, wherein the plurality of first codewords are transmitted to the memory array of the memory system based at least in part on the syndrome for the each second codeword of the plurality of second codewords indicating no errors or correctable errors in the each second codeword.

5. The apparatus of claim 3, wherein the controller is further configured to cause the apparatus to:
corrupt at least one bit of a first codeword of the plurality of first codewords based at least in part on the second error protection code of a corresponding one of the second codewords indicating a non-correctable error.

6. The apparatus of claim 2, wherein, to store the second plurality of codewords to the buffer, the controller is configured to cause the apparatus to:
transfer, to the buffer, the plurality of second codewords via a first data channel over a plurality of clock cycles, wherein, for each of the plurality of clock cycles, the transferring comprises transferring, over a first parity channel, first parity information for the first data channel.

7. The apparatus of claim 2, wherein, to retrieve the plurality of second codewords from the buffer, the controller is configured to cause the apparatus to:
transfer, from the buffer, the plurality of second codewords via a second data channel over a plurality of clock cycles, wherein, for each of the plurality of clock cycles, the transferring comprises transferring, over a second parity channel, second parity information for the second data channel.

8. The apparatus of claim 1, wherein, to obtain the plurality of protocol units, the controller is configured to cause the apparatus to:
receive a set of data units associated with the data block, wherein each data unit of the set of data units comprises a respective portion of one or more of the sets of first data and a respective set of third parity bits; and
generate the plurality of protocol units based at least in part on the respective third sets of parity bits matching respective fourth sets of parity bits generated from the respective portions of first data for the set of data units.

9. The apparatus of claim 8, wherein the set of data units are received via a host-driven logical block interface of an interface controller.

10. The apparatus of claim 9, wherein the interface controller receives the set of data units via a physical interface comprising one or more serial data lanes.

11. The apparatus of claim 1, wherein the check code is seeded with an address associated with the data block.

12. The apparatus of claim 1, wherein the controller is further configured to cause the apparatus to:
receive a read command for the data block;
read the data block and the check code from the memory array based at least in part on receiving the read command;
generate a check value based at least in part on reading the data block from the memory array; and
compare the check code and the check value based at least in part on generating the check value.

13. The apparatus of claim 12, wherein the controller is further configured to cause the apparatus to:
determine that the check code matches the check value; and transmit a second plurality of protocol units comprising the data block, wherein each protocol unit of the plurality of second protocol units comprises a respective set of second data and a respective third set of parity bits.

14. The apparatus of claim 12, wherein the controller is further configured to cause the apparatus to:
determine that the check code does not match the check value;
corrupt at least one bit associated with the data block based at least in part on determining that the check code does not match the check value; and
transmit the data block to a host system based at least in part on corrupting the at least one bit associated with the data block.

15. The apparatus of claim 12, wherein, to read the data block and the check code, the controller is configured to cause the apparatus to:
read the plurality of first codewords from the memory array; and
process the plurality of first codewords according to the first error protection scheme to obtain the data block and the check code.

16. The apparatus of claim 1, wherein the plurality of protocol units each comprise a Universal Flash Storage Protocol Information Unit (UPIU).

17. A non-transitory computer-readable medium storing code, the code comprising instructions executable by a processor to:
obtain a plurality of protocol units associated with a data block, wherein each protocol unit of the plurality of protocol units comprises a set of first data and a respective first set of parity bits;
process a first subset of the plurality of protocol units to obtain a first data storage unit based on respective first sets of parity bits matching respective second sets of parity bits generated from respective sets of first data for the first subset of the plurality of protocol units, wherein the first data storage unit comprises the data block and a check code generated from the data block; and
transmit a plurality of first codewords to a memory array of a memory system, wherein the plurality of first codewords comprise the data block and the check code, and wherein each first codeword comprises a first error protection code associated with a first error protection scheme.

18. The non-transitory computer-readable medium of claim 17, wherein
the instructions to transmit the plurality of first codewords are executable by the processor to:
store a plurality of second codewords in a buffer, wherein the plurality of second codewords comprise the data block and the check code, and wherein each second codeword comprises a second error protection code;
retrieve the plurality of second codewords from the buffer; and
generate the plurality of first codewords based on running a second error protection scheme on the plurality of second codewords.

19. The non-transitory computer-readable medium of claim 18, wherein the instructions to run the second error protection scheme are executable by the processor to:
generate, for each second codeword, a syndrome based at least in part on a data portion of the each second codeword and the second error protection code of the each second codeword.

20. The non-transitory computer-readable medium of claim 19, wherein the plurality of first codewords are transmitted to the memory array of the memory system based at least in part on the syndrome for the each second codeword of the plurality of second codewords indicating no errors or correctable errors in the each second codeword.

21. The non-transitory computer-readable medium of claim 19, wherein the instructions are further executable by the processor to:
corrupt at least one bit of a first codeword of the plurality of first codewords based at least in part on the second error protection code of a corresponding one of the second codewords indicating a non-correctable error.

22. The non-transitory computer-readable medium of claim 18, wherein the instructions to store the plurality of second codewords to the buffer are executable by the processor to:
transfer, to the buffer, the plurality of second codewords via a first data channel over a plurality of clock cycles, wherein, for each of the plurality of clock cycles, the transferring comprises transferring, over a first parity channel, first parity information for the first data channel.

23. The non-transitory computer-readable medium of claim 18, wherein the instructions to retrieve the plurality of second codewords from the buffer are executable by the processor to:
transfer, from the buffer, the plurality of second codewords via a second data channel over a plurality of clock cycles, wherein, for each of the plurality of clock cycles, the transferring comprises transferring, over a second parity channel, second parity information for the second data channel.

24. The non-transitory computer-readable medium of claim 17, wherein the instructions to obtain the plurality of protocol units are executable by the processor to:
receive a set of data units associated with the data block, wherein each data unit of the set of data units comprises a respective portion of one or more of the sets of first data and a respective set of third parity bits; and
generate the plurality of protocol units based at least in part on the respective third sets of parity bits matching respective fourth sets of parity bits generated from the respective portions of first data for the set of data units.

25. A method, comprising:
obtaining a plurality of protocol units associated with a data block, wherein each protocol unit of the plurality of protocol units comprises a set of first data and a respective first set of parity bits;
processing a first subset of the plurality of protocol units to obtain a first data storage unit based on respective first sets of parity bits matching respective second sets of parity bits generated from respective sets of first data for the first subset of the plurality of protocol units, wherein the first data storage unit comprises the data block and a check code generated from the data block; and
transmitting a plurality of first codewords to a memory array of a memory system, wherein the plurality of first codewords comprise the data block and the check code, and wherein each first codeword comprises a first error protection code associated with a first error protection scheme.

* * * * *